United States Patent
Eom et al.

(10) Patent No.: US 6,803,241 B2
(45) Date of Patent: Oct. 12, 2004

(54) METHOD OF MONITORING CONTACT HOLE OF INTEGRATED CIRCUIT USING CORONA CHARGES

(75) Inventors: Tae-min Eom, Sungnam (KR); Chung-sam Jun, Suwon (KR); Yu-sin Yang, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/338,832

(22) Filed: Jan. 9, 2003

(65) Prior Publication Data

US 2003/0129776 A1 Jul. 10, 2003

(30) Foreign Application Priority Data

Jan. 10, 2002 (KR) .......................................... 2002-1462

(51) Int. Cl.[7] .............................................. H01L 21/66
(52) U.S. Cl. ............................... 438/14; 17/18; 17/597; 17/598; 17/599; 17/637; 17/666
(58) Field of Search .............................. 438/14, 17–18, 438/597–599, 637, 666

(56) References Cited

U.S. PATENT DOCUMENTS 6,011,404 A    1/2000  Ma et al. .................... 324/765
6,069,017 A  * 5/2000  Kamieniecki et al. ........ 438/17
6,255,128 B1   7/2001  Chacon et al. ................ 438/17
6,315,574 B1 * 11/2001  Kamieniecki et al. ........ 438/14
2002/0090746 A1 * 7/2002  Xu et al. ...................... 438/17

FOREIGN PATENT DOCUMENTS

| JP | 2000-68345 | 3/2000 |
| JP | 2000-340624 | 12/2000 |
| JP | 2000-68345 | 3/2002 |

* cited by examiner

Primary Examiner—Lynne A. Gurley
(74) Attorney, Agent, or Firm—Lee & Sterba, P.C.

(57) ABSTRACT

A method of monitoring contact holes of an integrated circuit using corona charges is provided for determining whether the contact holes are open. The method includes transmitting corona charges over a unit chip having contact holes on a semiconductor wafer; measuring the surface voltage of the unit chip; making a graph illustrating a relationship between the amount of corona charges transmitted and the measured surface voltage of the unit chip; and analyzing the graph to determine whether the contact holes of the unit chip are open. According to the method of the present invention, contact holes may be monitored at an in-line state when manufacturing an integrated circuit by transmitting corona charges onto a unit chip, eliminating the need to use a scanning electronic microscope, thereby preventing a reduction in yield.

8 Claims, 8 Drawing Sheets

METHOD OF MONITORING CONTACT HOLE OF INTEGRATED CIRCUIT USING CORONA CHARGES

BACKGROUND OF THE INVENTION

1. Field of the Invention

The present invention relates to a method of monitoring contact holes of an integrated circuit. More particularly, the present invention relates to a method of monitoring contacts holes of an integrated circuit using corona charges to determine whether the contact holes are open.

2. Description of the Related Art

In general, when manufacturing integrated circuits, detecting whether contact holes are open is performed at an in-line state using an optical microscope or scanning electron microscope (SEM). However, due to a limited resolution inherent in the optical microscope, it is difficult to properly detect whether a fine contact hole is open with the optical microscope. Equally disadvantageously, it is impossible to detect the state of all chips (or dies) formed on a semiconductor wafer with the SEM, since a great deal of time is lost inspecting each sheet of a semiconductor wafer.

As a result, when manufacturing an integrated circuit, a process for detecting whether contact holes are open at an in-line state may be improperly carried out, thereby reducing the manufacturing yield.

SUMMARY OF THE INVENTION

In an effort to solve the problems described above, it is a feature of an embodiment of the present invention to provide a method of monitoring contact holes of an integrated circuit using corona charges at an in-line state when manufacturing an integrated circuit, to determine whether the contact holes are open.

To provide one feature of an embodiment of the present invention, there is provided a method of monitoring contact holes of an integrated circuit, the method including transmitting corona charges over a unit chip having contact holes on a semiconductor wafer; measuring a surface voltage of the unit chip; making a graph illustrating a relationship between the amount of corona charges transmitted and the measured surface voltage of the unit chip; and analyzing the graph to determine whether the contact holes of the unit chip are open. Determining whether the contact holes are open may be accomplished by determining a saturation level of the surface voltage of the unit chip or by determining if the surface voltage of the unit chip drops.

To provide another feature of an embodiment of the present invention, there is provided a method of monitoring contact holes of an integrated circuit, the method including transmitting corona charges over a unit chip having contact holes on a semiconductor wafer; measuring a surface voltage of the unit chip; making a graph illustrating a relationship between the amount of corona charges transmitted and the measured surface voltage of the unit chip; determining from the graph whether the measured surface voltage is saturated; and determining that the contact holes are not open when the measured surface voltage is not saturated and determining whether the contact holes are open when the measured surface voltage is saturated by comparing a measured surface saturation voltage of the unit chip with a predetermined surface saturation voltage of the unit chip. The unit chip may include a cell array region having regularly formed contact holes and a peripheral circuit region. Determining whether the contact holes are open may be accomplished by analyzing a difference between the measured surface saturation voltage of the unit chip and the predetermined surface saturation voltage of the unit chip. When the predetermined surface saturation voltage of the unit chip is a surface saturation voltage of a same unit chip having open contact holes and when the unit chip includes a cell array region having regularly formed contact holes and a peripheral circuit region, it may be determined that the contact holes are not open when the measured surface saturation voltage of the unit chip is higher than the predetermined surface saturation voltage of the unit chip.

To provide still another feature of an embodiment of the present invention, there is provided a method of monitoring contact holes of an integrated circuit, the method including transmitting corona charges over a unit chip having contact holes on a semiconductor wafer; measuring a surface voltage of the unit chip; making a graph illustrating a relationship between the amount of corona charges transmitted and the surface voltage of the unit chip; determining from the graph whether the measured surface voltage is saturated; and determining that the contact holes are not open when the surface voltage is not saturated, and determining whether the surface voltage drops when the surface voltage is saturated; determining whether the contact holes are open when the surface voltage drops by analyzing an extent that the surface voltage drops or a period over which the surface voltage drops, and determining whether the contact holes are open when the surface voltage does not drop by comparing a measured surface saturation voltage of the unit chip with a predetermined surface saturation voltage of the unit chip. The unit chip may include a cell array region in which the contact holes are uniformly formed. Determining whether the contact holes are open when the surface voltage does not drop may be accomplished by analyzing a difference between the measured surface saturation voltage of the unit chip and the predetermined surface saturation voltage of the unit chip.

As described above, in a method of monitoring contact holes of an integrated circuit according to the present invention, corona charges are transmitted over a unit chip having contact holes on a semiconductor wafer, the surface voltage of the unit chip is measured, and then whether the contact holes are open is monitored. Accordingly, it is possible to monitor whether contact holes are open at an in-line state during integrated circuit manufacture by transmitting corona charges onto a unit chip, thereby eliminating the need for a scanning electron microscope, and preventing a reduction in the manufacturing yield.

BRIEF DESCRIPTION OF THE DRAWINGS

The above and other features and advantages of the present invention will become more apparent upon review of a detailed description of preferred embodiments thereof with reference to the attached drawings in which.

DETAILED DESCRIPTION OF THE INVENTION

Figure 1:
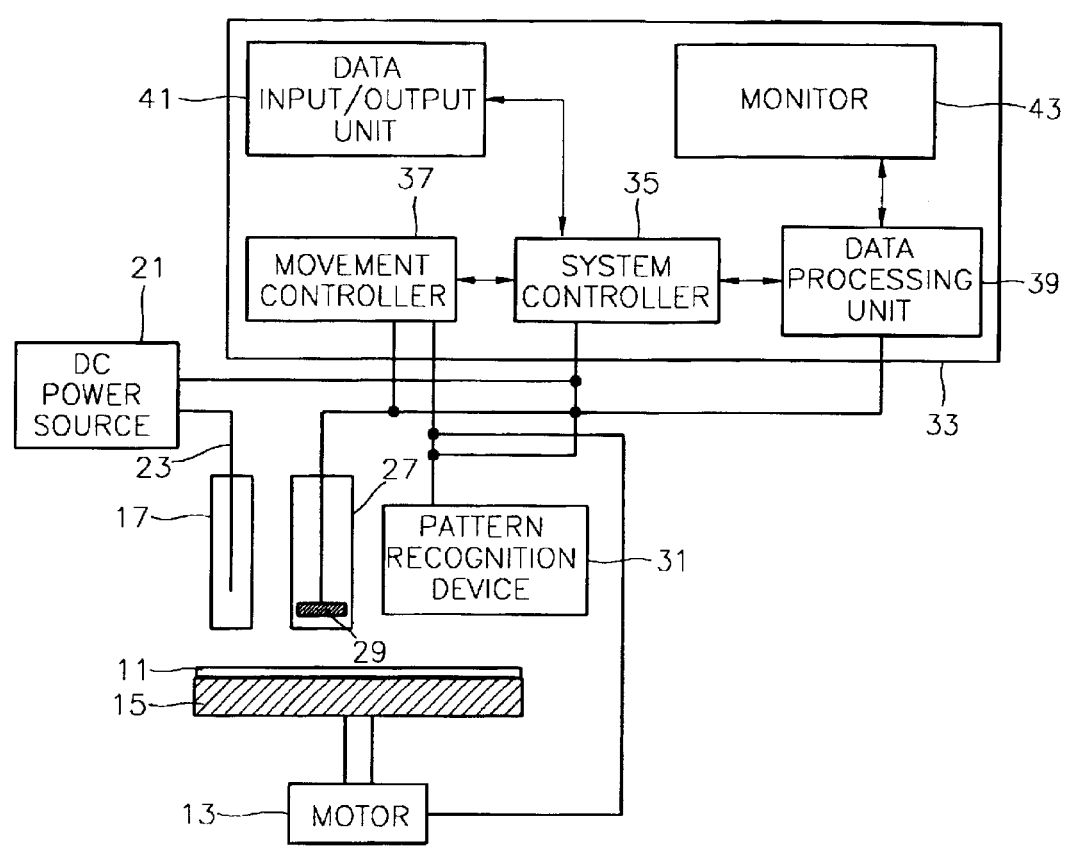
FIG. 1 illustrates a schematic view of a monitoring apparatus for monitoring contact holes of an integrated circuit according to the present invention.

Korean Patent Application No. 2002-1462, entitled "Method Of Monitoring Contact Hole Of Integrated Circuit Using Corona Charges," filed on Jan. 10, 2002, is incorporated by reference herein in its entirety.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. The same reference numerals in different drawings represent the same element, and thus their descriptions will be omitted.

Figure 2A:
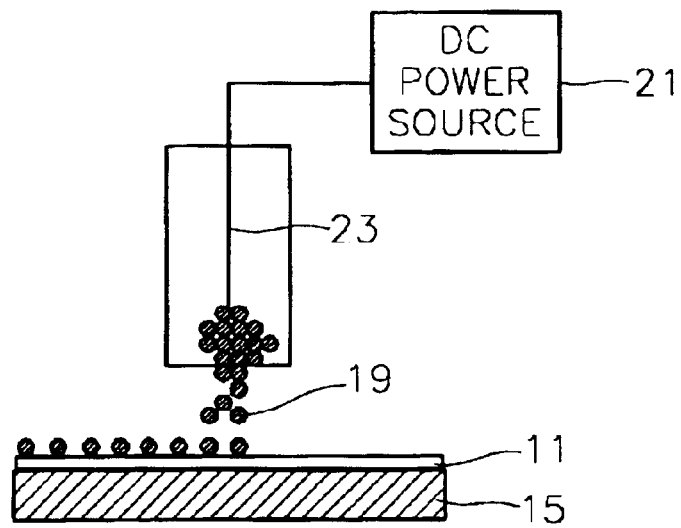
FIGS. 2A and 2B illustrate enlarged views of a corona charger shown in FIG. 1.
Figure 2B:
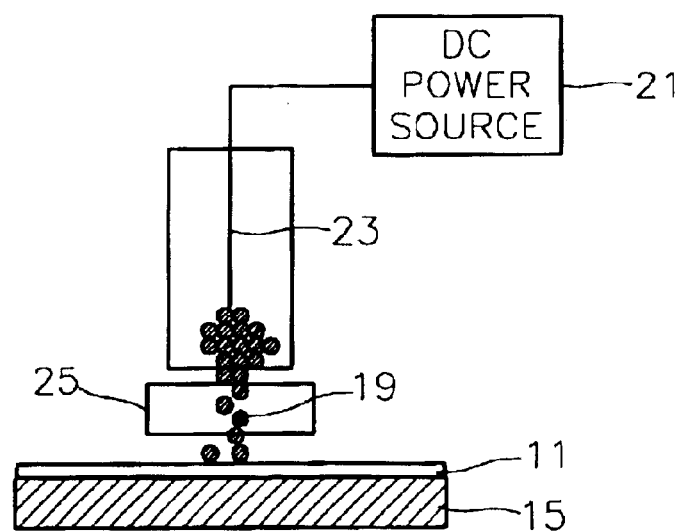
Figure 3:
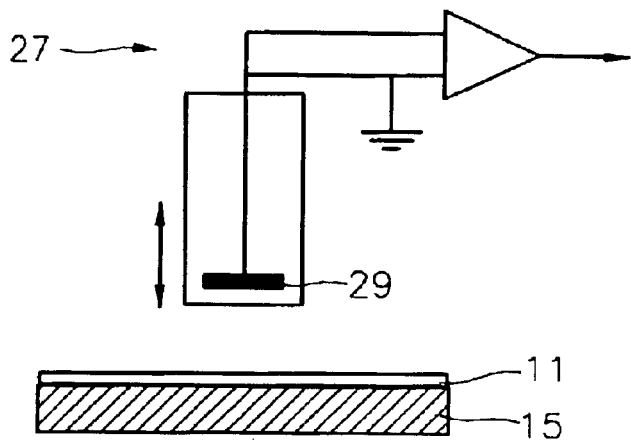
FIG. 3 illustrates an enlarged view of a surface voltage measuring device shown in FIG. 1.

FIG. 1 illustrates a schematic view of an apparatus for monitoring contact holes of an integrated circuit (hereinafter, "monitoring apparatus"). FIGS. 2A and 2B illustrate enlarged views of a corona charger shown in FIG. 1. FIG. 3 illustrates an enlarged view of a surface voltage measuring device shown in FIG. 1.

Referring to FIGS. 1, 2A, 2B and 3, the monitoring apparatus according to the present invention includes a chuck 15 onto which a semiconductor wafer 11 is loaded, a motor 13 used to rotate the chuck 15, and a corona charger 17 for transmitting corona charges 19 on the semiconductor wafer 11 so that surface charges may be accumulated thereon.

There are two types of corona chargers 17: a full-transmission type corona charger for transmitting the corona charges 19 over the entire surface of the semiconductor wafer 11, which is illustrated in FIG. 2A, and a partial-transmission type corona charger for transmitting the corona charges 19 to only a predetermined portion of the semiconductor wafer 11, which is illustrated in FIG. 2B. When the corona charges 19 are sprayed onto the entire surface of the semiconductor wafer 11, portions other than a portion to be measured may be damaged by the corona charges 19. Thus, the partial-transmission type corona charger 17 is used so that the corona charges 19 accumulate on only a portion of the semiconductor wafer 11 to be measured.

The corona charges 19 are generated at a corona wire 23 connected to a DC power source 21. Controlling the electric current of the DC power source 21 controls the amount of corona charges generated. In particular, as may be seen in FIG. 2B, the partial-transmission type corona charger 17 includes a magnetic field generator 25 for concentrating the corona charges 19 onto a specific portion of the semiconductor wafer 11. That is, when the corona charges 19 are generated at the corona wire 23 and transmitted to the semiconductor wafer 11, the magnetic field generator 25 generates a magnetic force in the form of a circle that allows the corona charges 19 to be concentrated on the semiconductor wafer 11 at the specific portion thereof to be measured. To increase the regularity of the corona charges 19 on the semiconductor wafer 11, the chuck 15 may be rotated by the motor 13. Preferably, the corona charges 19 include $(H_2O)_n H^+$, where 'n' is a positive integer, as positive corona charges and $CO_3^-$ as negative corona charges.

A surface voltage measuring device 27 for measuring the surface voltage of the semiconductor wafer 11 according to the corona charges 19 transmitted, is installed above the semiconductor wafer 11. As shown in FIG. 3, the surface voltage measuring device 27 measures the surface voltage of the semiconductor wafer 11 without being in contact with the semiconductor wafer 11. A measuring probe 29 is positioned a predetermined distance from the surface of the semiconductor wafer 11, and forms a capacitor together with the semiconductor wafer 11. A voltage applied to the capacitor is indicated by a contact potential difference Vcpd. When the measuring probe 29 is oscillated up and down by a predetermined frequency w, its capacitance changes to generate an electric current J. The electric current J having the predetermined frequency w is correctly measured by a lock-in detection system that measures variations in a signal according to the frequency w using a lock-in amplifier. Since the measured electric current J is in proportion to the contact potential difference Vcpd, the surface voltage is precisely measured through calibration by the following equation: $J = \Delta Q/\Delta t = Vcpd \cdot \Delta C/\Delta t$. Here, $\Delta C$ denotes variations in the capacitance, and $\Delta t$ denotes variations in time.

In addition, as shown in FIG. 1, a pattern recognition device 31 for recognizing a pattern on the semiconductor wafer 11 is installed on the semiconductor wafer 11. The pattern recognition device 31 recognizes a pattern formed on the semiconductor wafer 11 to facilitate transmission of the corona charges 19 to a specific portion of the semiconductor wafer 11, and to measure the surface voltage thereof. Also, the pattern recognition device 31 stores an image in an align process, analyzes the stored image, and recognizes alignment points of the image. Thus, it is possible to transmit corona charges onto only a specific, predetermined portion of the semiconductor wafer 11, and to measure the surface voltage thereof at the predetermined portion.

Also, the monitoring apparatus of FIG. 1 includes a central processing unit (CPU) 33 that is connected to the corona charger 17, the surface voltage measuring device 27, the pattern recognition device 31, and the motor 13, which is connected to the chuck 15. The CPU 33 drives and controls the elements to which it is connected, and further processes and outputs measured data. The CPU 33 includes a system controller 35 for controlling the amount of corona charges 19 generated by the corona chargers 17 and for storing data of surface voltages measured. The CPU 33 further includes a movement controller 37 for oscillating the probe 29 of the surface voltage measuring device 27 and for moving the chuck 16 according to a pattern recognized by the pattern recognition device 31; and a data processing unit 39 for processing data regarding corona charges transmitted by the semiconductor device 11 and the measured surface voltage, the data processing unit 39 being connected to the system controller 35. In particular, the data processing unit 39 processes data relating the amount of corona charges 19 to the surface voltage. Also, a data input/output unit 41 is connected to the system controller 35, and a monitor 43 is connected to the data processing unit 39.

Figure 4A:
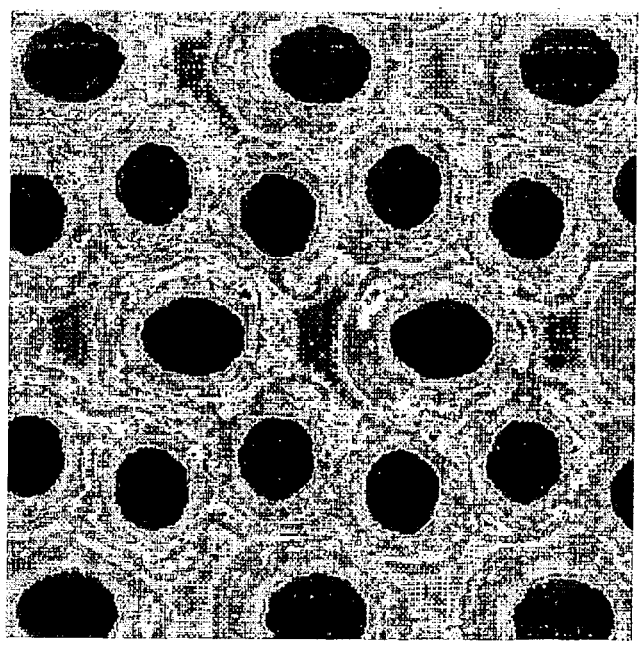
FIGS. 4A through 4C illustrate images of samples of semiconductor wafers used in monitoring contact holes of an integrated circuit using the monitoring apparatus shown in FIG. 1.
Figure 4B:
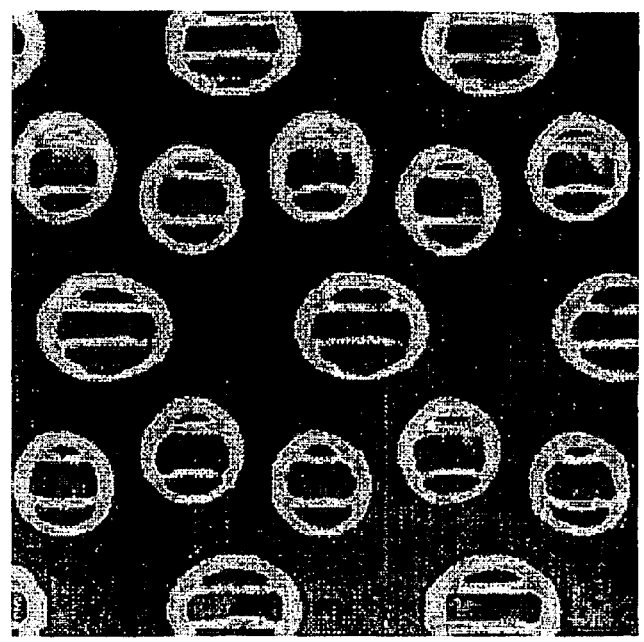
Figure 4C:
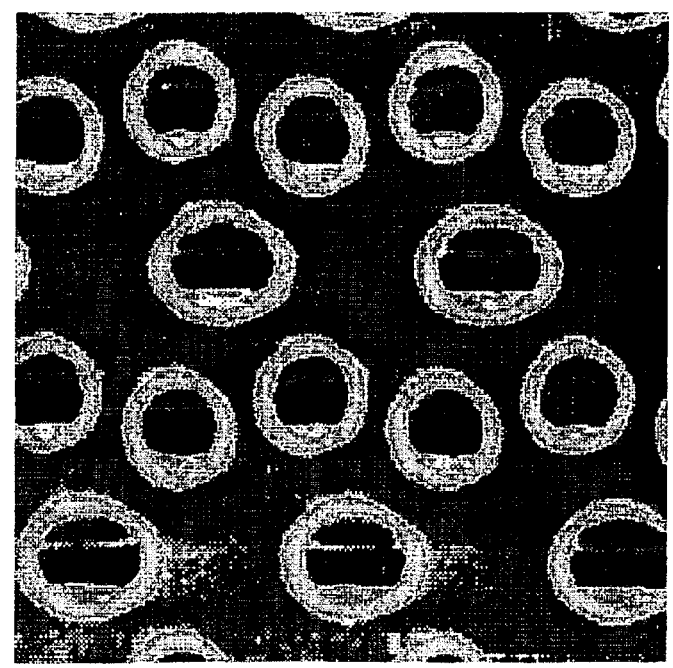

In FIGS. 4A through 4C, samples of semiconductor wafers for monitoring contact holes of an integrated circuit using the monitoring apparatus of FIG. 1 are illustrated. Specifically, each of FIGS. 4A through 4C illustrates a cell array region of one unit chip (or unit die) formed on a semiconductor wafer during a process of etching contact holes when manufacturing an integrated circuit (IC), and was taken by a scanning electron microscope (SEM). FIG. 4A illustrates a SEM picture of a first sample; a cell array region coated with a photoresist. FIG. 4B illustrates a SEM picture of a second sample; a cell array region in which a contact etching process is properly performed on a semiconductor wafer to form a plurality of open contact holes thereon. FIG. 4C illustrates a SEM picture of a third sample; a cell array region in which a contact etching process is not properly performed, so that a thin portion of an oxide layer remains in the contact holes formed thereon, and the contact holes are therefore not open.

Hereinafter, using the monitoring apparatus of FIG. 1, corona charges are transmitted to each of the samples of the semiconductor wafers illustrated in FIGS. 4A through 4C, a surface voltage of the first through third samples is measured, and a determination is made regarding whether contact holes of the first through third samples are open.

While monitoring the state of the contact holes, i.e., determining whether the contact holes are open, the surface voltage is measured with respect to a unit chip including both a cell array region and a peripheral circuit region (not shown in FIGS. 4A through 4C) and a unit chip region including only the cell array region of the samples.

Figure 5:
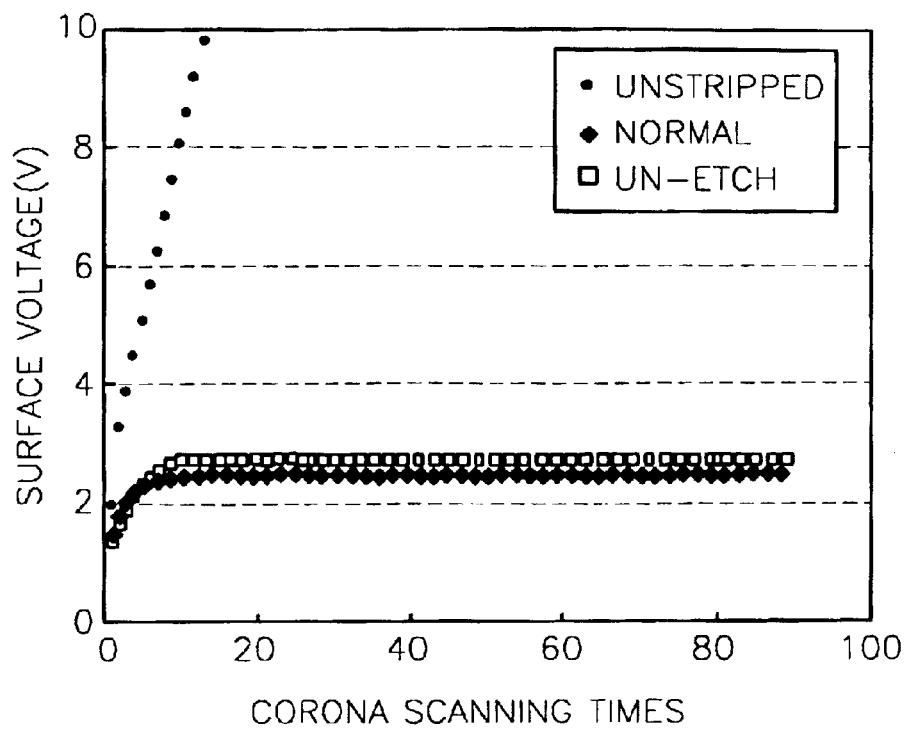
FIGS. 5 and 6 illustrate graphs showing results of monitoring contact holes of an integrated circuit using the samples of FIGS. 4A through 4C and the monitoring apparatus shown in FIG. 1.
Figure 6:
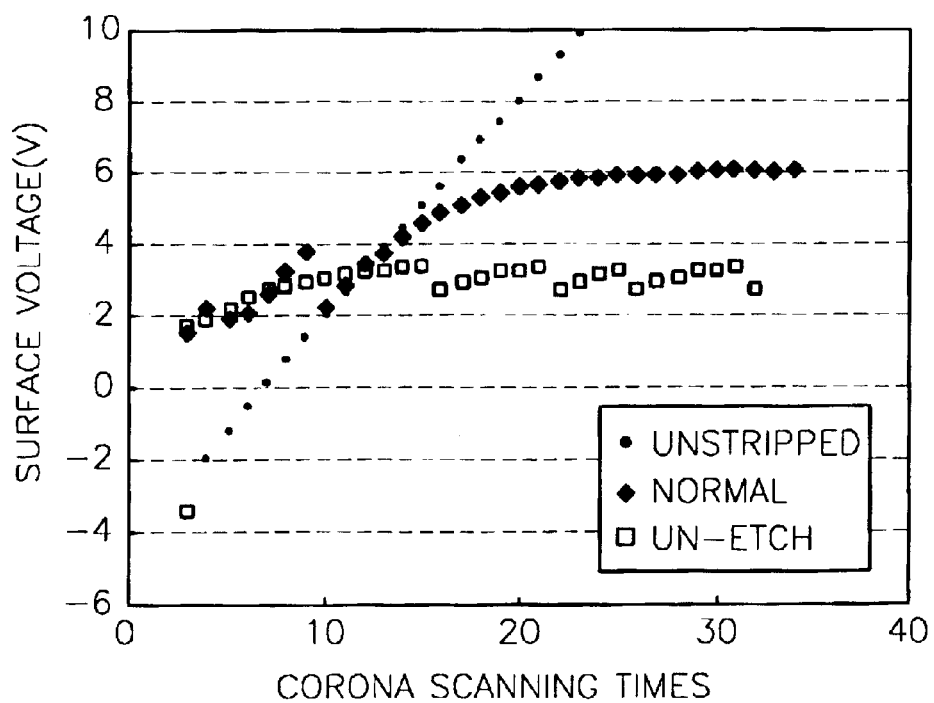

FIGS. 5 and 6 illustrate graphs of results obtained from monitoring contact holes of an integrated circuit formed on the samples shown in FIGS. 4A through 4C using the monitoring apparatus of FIG. 1. In FIGS. 5 and 6, the X-axes indicate the corona scanning times, and correspondingly, the amount of corona charges transmitted. The Y-axes in FIGS. 5 and 6 denote the surface voltage of the unit chips.

Referring to FIG. 5, corona charges are transmitted to a unit chip including a cell array region and a peripheral circuit region (not shown in FIGS. 4A through 4C), and the surface voltage of the unit chip is measured.

It is noted in FIG. 5 that the surface voltage is not saturated in the photoresist-coated first sample of a semiconductor wafer, which is indicated as 'unstripped' and by '●' in FIG. 5. That is, an increase in corona charges accumulated on the first sample results in an increase in its surface voltage.

However, the surface voltage is saturated in the properly etched second sample having open contact holes, which is indicated as 'normal' and by '◆' in FIG. 5. The surface voltage is also saturated in the improperly etched third sample, in which an insulating material remains in the contact holes. The third sample is indicated as 'unetched' and by '□' in FIG. 5.

The third sample (□) having the improperly etched contact holes has a higher saturation voltage than the second sample (◆) having the properly etched contact holes. This is because oxide layers not etched during the contact etching process remain in the contact holes of the third sample (□) and function as insulating materials. As a result, exhaustion of the corona charges is prevented in the third sample (□) in which the contact holes are not open, and the saturation voltage increases. Therefore, it is possible to determine whether the contact holes are open in the various samples by comparing their surface saturation voltages. The contact holes of the integrated circuit may be monitored by comparing the surface saturation voltage of the third sample (□) having the improperly etched, unopened, contact holes with that of the second sample (◆) having the properly etched, open, contact holes. When the surface voltage is measured with respect to a unit chip including both a cell array region and a peripheral circuit region, if the surface saturation voltage of the sample being measured is higher than that of a predetermined surface saturation voltage in a sample having open contact holes, it may be determined that the contact holes of the sample being measured are not open.

FIG. 6 illustrates a graph of results obtained by transmitting corona charges to a unit chip region including only a cell array region and measuring the surface voltage of the unit chip region.

As shown in FIG. 6, when the corona charges are transmitted to the unit chip region having only a cell array region, the surface voltage continuously increases in the first sample having the photoresist coating, which is indicated as 'unstripped' and by '●' in FIG. 6. However, the surface voltage is saturated in the second sample (◆) having the properly etched contact holes and in the third sample (□) having the improperly etched contact holes.

In the case of the third sample (□) having the improperly etched, unopened, contact holes, once the surface voltage is saturated, further transmission of a predetermined amount of corona charges to the third sample results in a decrease in the surface voltage. Therefore, as illustrated in FIG. 6, the surface voltage drop may be seen periodically each time the predetermined amount of corona charges is transmitted to the third sample after the surface voltage is saturated. This drop in the surface voltage occurs because the oxide layers remaining in the contact holes of the third sample (□) are thin, so that a breakdown of the cell array region occurs, thereby exhausting all of the corona charges from the third sample (□) when only the cell array region is measured.

Based on the results obtained by monitoring the first through third samples of semiconductor wafers described above, it has been established that there are various methods of monitoring contact holes. Some embodiments of methods of monitoring contact holes according to the present invention will now be described with reference to FIGS. 7 through 9.

Figure 7:
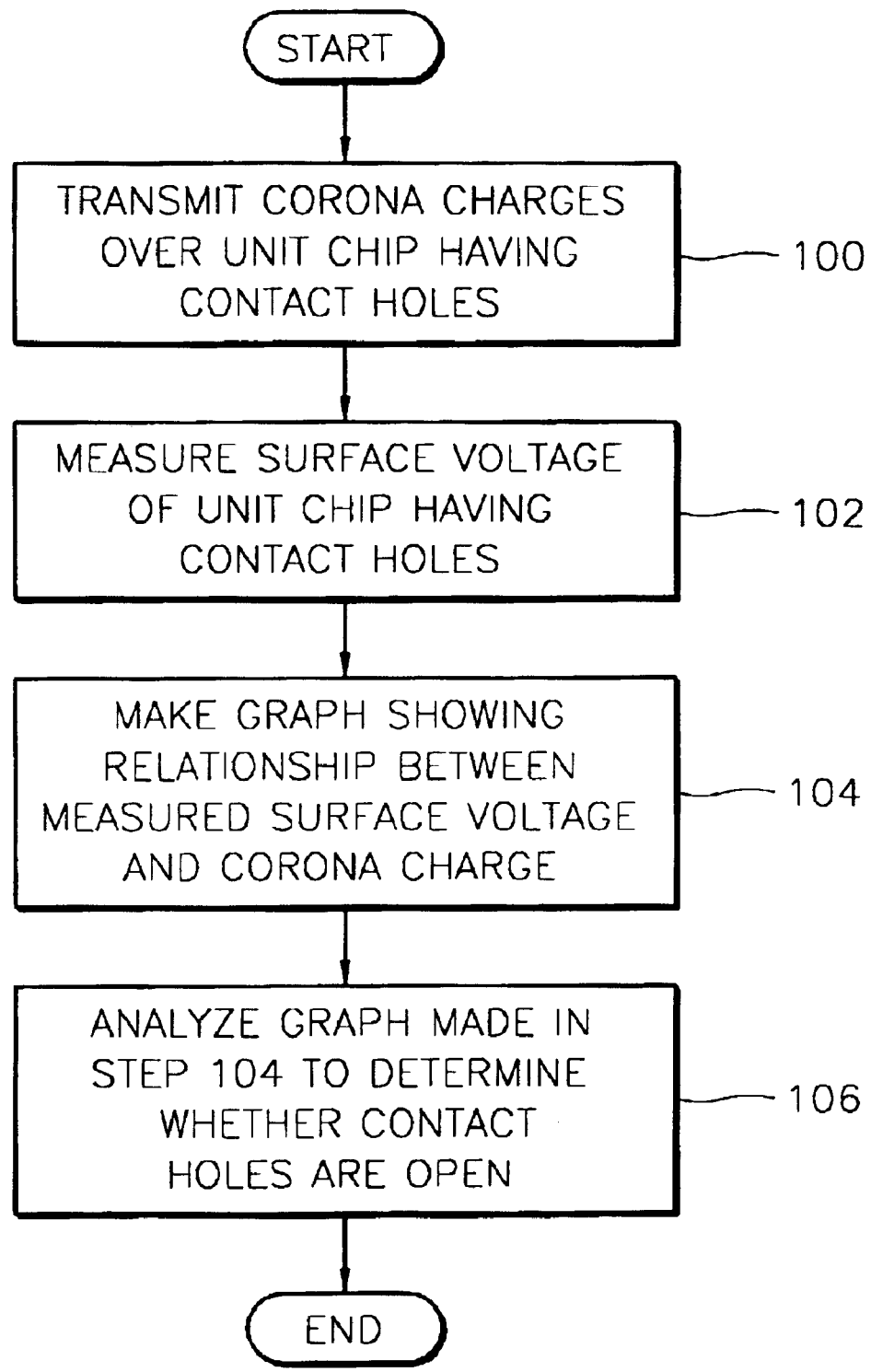
FIG. 7 illustrates a flow chart explaining a method of monitoring contact holes of an integrated circuit according to a first embodiment of the present invention.

FIG. 7 illustrates a flowchart for explaining a method of monitoring contact holes of an integrated circuit according to a first embodiment of the present invention. In the method shown in FIG. 7, using the monitoring apparatus of FIG. 1 and the corona charger of FIG. 2A or 2B, corona charges are transmitted in step 100 over a unit chip (or a unit die) having contact holes on a semiconductor wafer so that the corona charges are accumulated thereon.

Next, the surface voltage of the unit chip having contact holes is measured in step 102 using the surface voltage measuring device of FIG. 3. Thereafter, a graph illustrating a relationship between the amount of corona charges transmitted and the measured surface voltage is obtained in step 104 using the CPU of FIG. 1.

Then, in step 106, the graph obtained in step 104 is analyzed to determine whether the contact holes are open by determining whether the measured surface voltage is saturated or drops.

Figure 8:
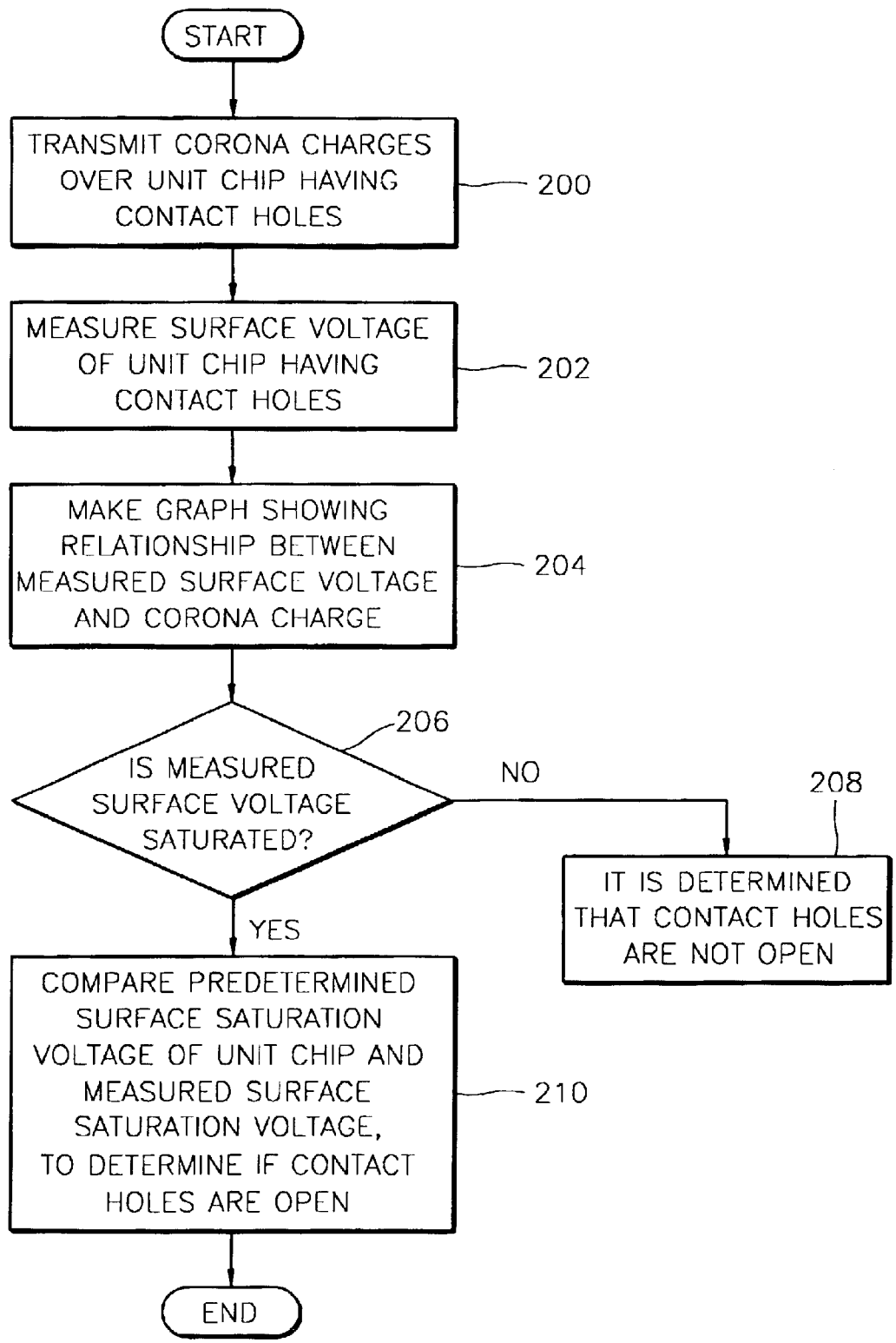
FIG. 8 illustrates a flow chart explaining a method of monitoring contact holes of an integrated circuit according to a second embodiment of the present invention.

FIG. 8 illustrates a flowchart for explaining a method of monitoring contact holes of an integrated circuit according to a second embodiment of the present invention. In step 200 of the method shown in FIG. 8, using the monitoring apparatus illustrated in FIG. 1 and the corona charger illustrated in FIG. 2A or 2B, corona charges are transmitted over a unit chip having contact holes on a semiconductor wafer so that the corona charges are accumulated thereon.

Next, the surface voltage of the unit chip is measured in step 202 using the surface voltage measuring device illustrated in FIG. 3. Then, using the CPU of FIG. 1, a graph illustrating a relationship between the amount of corona charges transmitted and the surface voltage measured is obtained in step 204.

Thereafter, in step 206, the graph obtained in step 204 is analyzed to determine if the measured surface voltage is saturated. If the graph reveals that the surface voltage is not saturated, it is determined in step 208 that the contact holes formed on the semiconductor wafer are not open. In contrast, if the graph reveals that the surface voltage is saturated, whether the contact holes are open is determined in step 210 by comparing a predetermined surface saturation voltage of the unit chip, i.e., the surface saturation voltage of the properly etched unit chip, and a surface saturation voltage of the unit chip measured. A difference between these two saturation voltages is analyzed to determine whether the contact holes are open.

Figure 9:
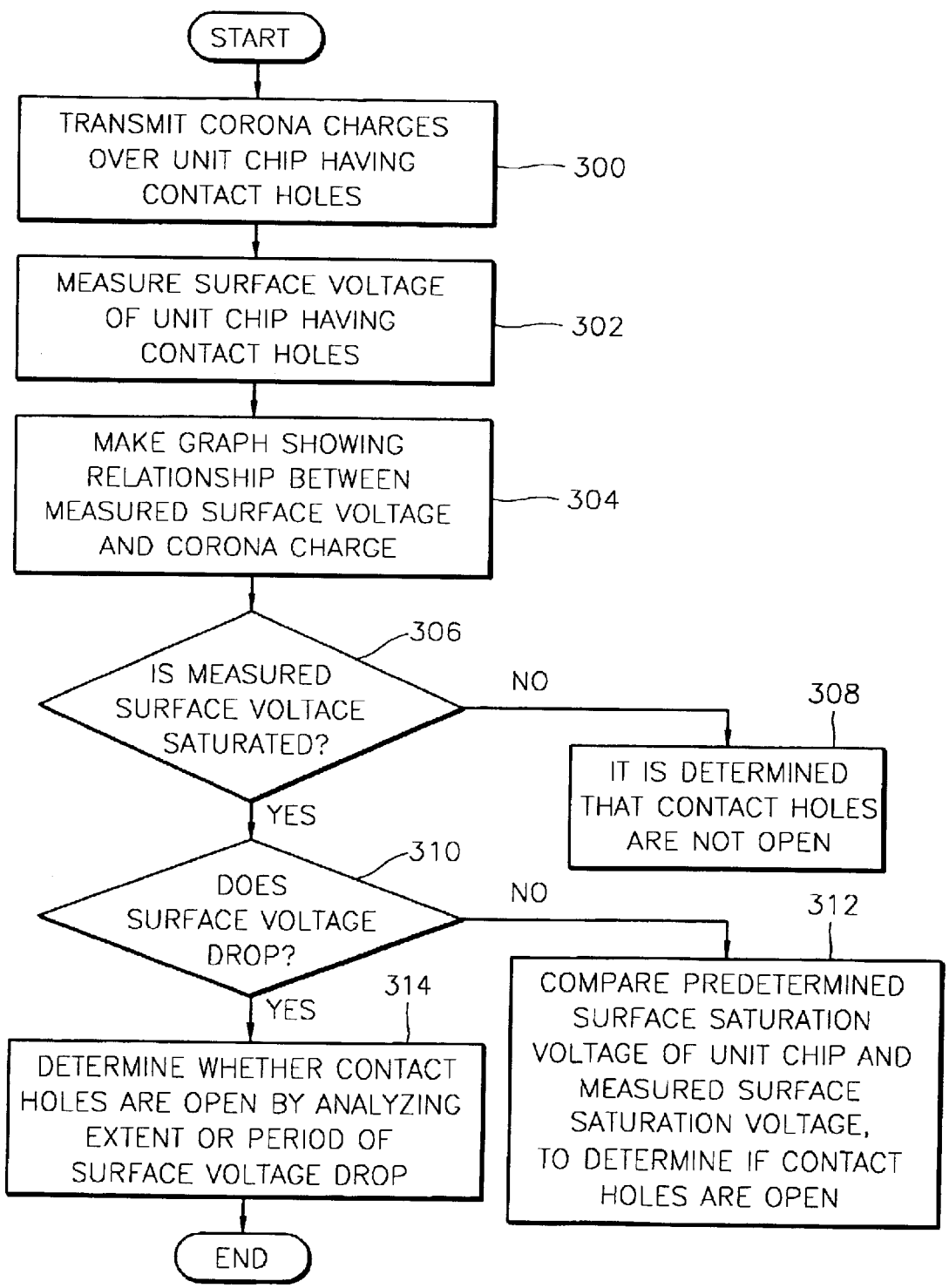
FIG. 9 illustrates a flow chart explaining a method of monitoring contact holes of an integrated circuit according to a third embodiment of the present invention.

FIG. 9 illustrates a flowchart for explaining a third embodiment of a method of monitoring contact holes of an integrated circuit according to the present invention. In the method of FIG. 9, using the monitoring apparatus of FIG. 1 and the corona charger of FIG. 2A or 2B, corona charges are transmitted over a unit chip (or a unit die) having contact holes on a semiconductor wafer in step 300, so that corona charges are accumulated thereon.

Next, the surface voltage of the unit chip having the contact holes is measured in step 302 using the surface voltage measuring device of FIG. 3. Then, a graph illustrating a relationship between the amount of corona charges transmitted and the measured surface voltage is obtained in step 304 using the CPU illustrated in FIG. 1.

Thereafter, the graph of step 304 is analyzed in step 306 to determine whether the measured surface voltage is saturated. If the graph reveals that the measured surface voltage is not saturated, it is determined in step 308 that the contact holes formed on the semiconductor wafer are not open.

If the graph reveals that the surface voltage is saturated, whether the surface voltage drops is determined in step 310.

In the event that the surface voltage does not drop, a predetermined surface saturation voltage of the unit chip, i.e., the surface saturation voltage of the properly etched unit chip, is compared with a measured surface saturation voltage of the unit chip in step 312 to determine whether the contact holes are open. That is, a difference between the measured surface saturation voltage of the unit chip and the surface saturation voltage of the properly etched unit chip is analyzed, and based on the results of the analysis, it is determined whether the contact holes are open.

In the event that the surface voltage drops, whether the contact holes are open is determined in step 314 by analyzing an extent that the surface voltage drops or a period over which the surface voltage drops.

As described above, in a method of monitoring contact holes of an integrated circuit according to the present invention, corona charges are transmitted over a unit chip having contact holes on a semiconductor wafer, the surface voltage of the unit chip is measured, and whether the contact holes are open is determined. In particular, the status of the contact holes may be determined by examining a difference between the saturation voltage of the measured surface voltage and a predetermined surface saturation voltage, and determining whether the surface voltage drops.

Accordingly, the present invention facilitates monitoring the status of contact holes at an in-line state during integrated circuit manufacture by transmitting corona charges onto a unit chip, as opposed to using a scanning electron microscope, thereby preventing a reduction in yield such as occurs with the use of a scanning electron microscope.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of monitoring contact holes of an integrated circuit, the method comprising:

transmitting corona charges over a unit chip having contact holes on a semiconductor wafer;

measuring a surface voltage of the unit chip;

making a graph illustrating a relationship between the amount of corona charges transmitted and the measured surface voltage of the unit chip; and analyzing the graph to determine whether the contact holes of the unit chip are open by determining a saturation level of the surface voltage of the unit chip or by determining if the surface voltage of the unit chip drops.

2. A method of monitoring contact holes of an integrated circuit, the method comprising:

transmitting corona charges over a unit chip having contact holes on a semiconductor wafer;

measuring a surface voltage of the unit chip;

making a graph illustrating a relationship between the amount of corona charges transmitted and the measured surface voltage of the unit chip;

determining from the graph whether the measured surface voltage is saturated; and determining that the contact holes are not open when the measured surface voltage is not saturated and determining whether the contact holes are open when the measured surface voltage is saturated by comparing a measured surface saturation voltage of the unit chip with a predetermined surface saturation voltage of the unit chip.

3. The method of monitoring contact holes as claimed in claim 2, wherein the unit chip comprises a cell array region having contact holes formed by a conventional process, and a peripheral circuit region.

4. The method of monitoring contact holes as claimed in claim 3, wherein the predetermined surface saturation voltage of the unit chip is a surface saturation voltage of a unit chip having open contact holes, and wherein determining whether the contact holes are open is accomplished by analyzing a difference between the measured surface saturation voltage of the unit chip and the predetermined surface saturation voltage of the unit chip, and determining that the contact holes are not open when the measured surface saturation voltage of the unit chip is higher than the predetermined surface saturation voltage of the unit chip.

5. The method of monitoring contact holes as claimed in claim 2, wherein determining whether the contact holes are open is accomplished by analyzing a difference between the measured surface saturation voltage of the unit chip and the predetermined surface saturation voltage of the unit chip.

6. A method of monitoring contact holes of an integrated circuit, the method comprising:
- transmitting corona charges over a unit chip having contact holes on a semiconductor wafer;
- measuring a surface voltage of the unit chip;
- making a graph illustrating a relationship between the amount of corona charges transmitted and the surface voltage of the unit chip;
- determining from the graph whether the measured surface voltage is saturated;
- determining that the contact holes are not open when the surface voltage is not saturated, and determining whether the surface voltage drops when the surface voltage is saturated; and
- determining whether the contact holes are open when the surface voltage drops by analyzing an extent that the surface voltage drops or a period over which the surface voltage drops, and determining whether the contact holes are open when the surface voltage does not drop by comparing a measured surface saturation voltage of the unit chip with a predetermined surface saturation voltage of the unit chip.

7. The method of monitoring contact holes as claimed in claim 6, wherein the unit chip comprises a cell array region in which the contact holes are formed.

8. The method of monitoring contact holes as claimed in claim 6, wherein determining whether the contact holes are open when the surface voltage does not drop is accomplished by analyzing a difference between the measured surface saturation voltage of the unit chip and the predetermined surface saturation voltage of the unit chip.

* * * * *